United States Patent [19]

Hamilton

[11] 4,306,160
[45] Dec. 15, 1981

[54] CHARGE COUPLED DEVICE STAIRCASE ELECTRODE MULTIPLEXER

[75] Inventor: James M. Hamilton, Hawthorne, Calif.

[73] Assignee: Hughes Aircraft Company, Culver City, Calif.

[21] Appl. No.: 226,325

[22] Filed: Jan. 19, 1981

Related U.S. Application Data

[63] Continuation of Ser. No. 60,431, Jul. 25, 1979.

[51] Int. Cl.³ .................. G11C 19/28; H01L 29/78
[52] U.S. Cl. ............................. 307/221 D; 357/24; 365/183
[58] Field of Search ............. 357/24; 307/221 D; 365/183

[56] References Cited

U.S. PATENT DOCUMENTS

| | | | |
|---|---|---|---|
| 3,902,186 | 8/1975 | Engeler et al. | 357/24 |
| 3,913,077 | 10/1975 | Erb | 357/24 |
| 3,967,254 | 6/1976 | Kosonocky et al. 357 | 24/ |
| 4,056,737 | 11/1977 | Sequin | 357/24 |
| 4,134,028 | 1/1979 | Kosonocky et al. | 357/24 |
| 4,199,691 | 4/1980 | Angle | 357/24 |
| 4,211,936 | 7/1980 | Kosonocky et al. | 357/24 |

OTHER PUBLICATIONS

Kohyama et al., "A New Multiplexed Electrode-Per-Bit Structure for a 64-KBit Charge Coupled device Memory" J. Solid-State Circuits vol. SC-12 (8/77) pp. 335-343.
Sequin et al., *Charge Transfer Devices* Academic Press, N.Y. (1975) pp. 243-249.

*Primary Examiner*—Gene M. Munson
*Attorney, Agent, or Firm*—Robert M. Wallace; William H. MacAllister

[57] ABSTRACT

A charge coupled device multiplexed parallel channel storage array useful with a serial input register having a storage density unconstrained by the serial register and effective for storing analog information. The same serial register cell reads charge packets sequentially to successive parallel channels by means of a single multiplexer electrode overlying the entrances to the parallel channels in a staircase configuration to which the entrances themselves conform.

5 Claims, 26 Drawing Figures

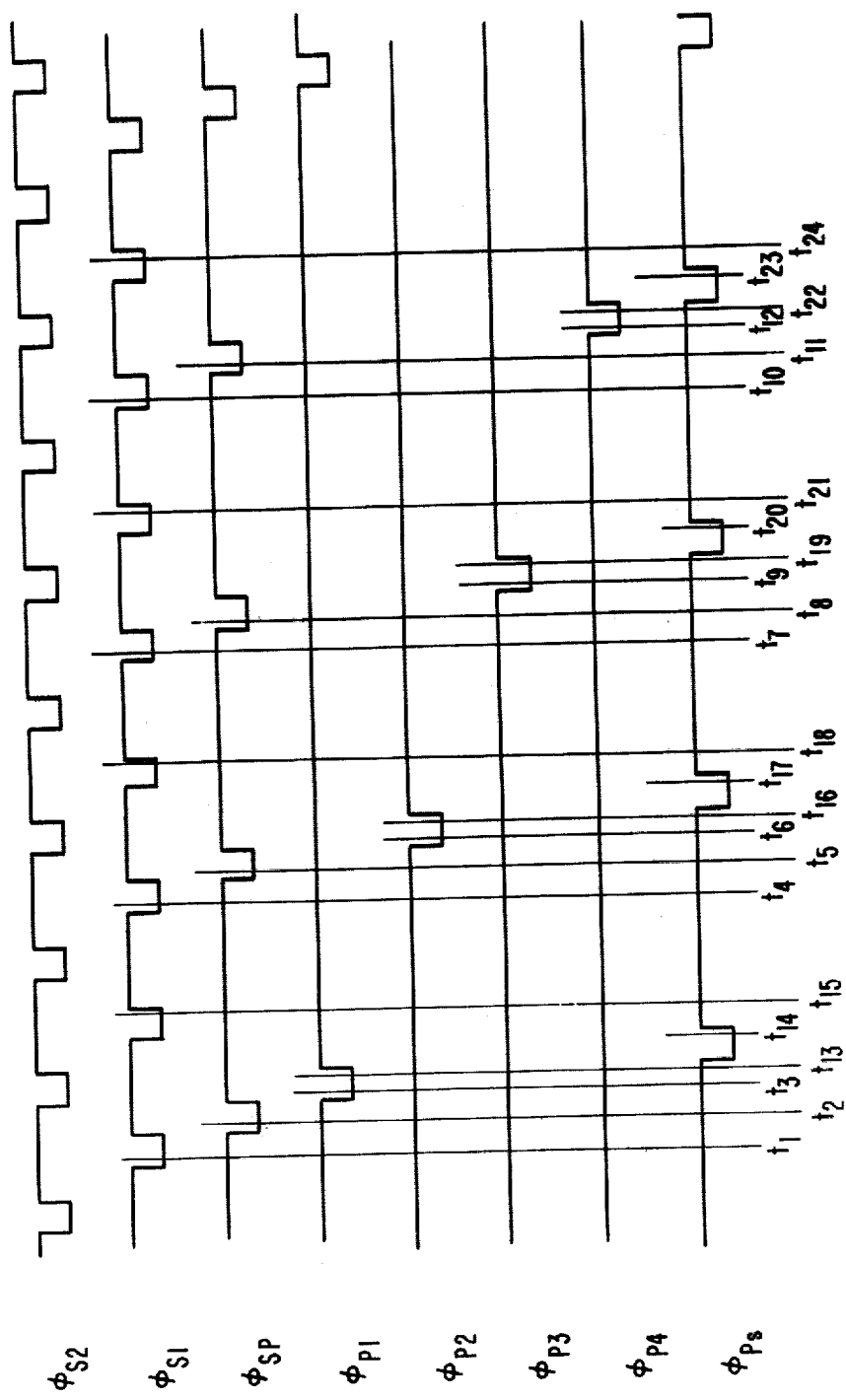

4,306,160

CHARGE COUPLED DEVICE STAIRCASE ELECTRODE MULTIPLEXER

This is a continuation of application Ser. No. 060,431, filed July 25, 1979.

TECHNICAL FIELD

This invention relates to charge coupled devices and in particular to series-parallel-series memories and parallel storage arrays.

BACKGROUND ART

The storage of information using charge coupled devices has facilitated fabrication of high density memory devices. Typically, charge coupled device memories have taken the form of the series-parallel-series configuration well known in the art. (See for example Sequin et al, *Charged Transfer Devices*, Academic Press, 1975, page 244). A charge coupled device (CCD) serial input register loads charge packets in parallel fashion into a plurality of parallel CCD registers. Charge is extracted from the parallel CCD registers into a CCD serial output register in parallel fashion. Each parallel CCD register receives the input charge packets from a particular cell of the serial CCD input register. As a result, the spacing, and therefore the density, of the parallel storage array is a function of the spacing of the serial CCD register cells. U.S. Pat. No. 3,913,077 to Erb discloses an interlaced series-parallel arrangement in which the density of the parallel storage array is doubled. Nevertheless, in the interlaced arrangement of the Erb patent the density of the parallel storage array is still a function of the spacing of the cells in the serial CCD registers, since each of the parallel registers in the interlaced device of Erb receives charge from a particular cell of the serial CCD input register.

A parallel storage array in which the input serial CCD register is eliminated is disclosed in Kohyama et al, "A New Multiplexed Electrode Per-Bit Structure for a 64 K-Bit Charged Coupled Device Memory," *IEEE Journal of Solid State Circuits*, Vol. SC-12, No. 4 August 1977, pages 335 through 343. The device disclosed in the Kohyama publication is not useful with a CCD serial input register, since this device requires a voltage input such as the fill and spill charge injection method disclosed in a Kohyama publication. This is because each input charge packet must be sufficient in quantity to fill the entire input portion of each of the parallel channels before a portion of the charge packet is fed into a particular one of the parallel channels. The remainder of the charge falls back into the fill and spill input structure. As a result, it is not desirable to use the device disclosed in the Kohyama publication to store charge packets representing analog information. Instead, the device of the Kohyama publication is intended for storage of digital information only.

In summary, the density of the parallel storage array in a series-parallel-series memory has been constrained by the spacing of the storage cells in the serial CCD input register, because the same serial register cell always transfers charge into the same parallel channel. Parallel storage arrays in which this disadvantage was removed, as in the Kohyama device, are not useful with a serial input CCD register, and furthermore are not preferably used to store charge packets representing analog information.

SUMMARY OF THE INVENTION

The foregoing disadvantages of the prior art are overcome in this invention, a multiplexed parallel channel storage array which, although useful with a serial CCD input register, has a density which is unconstrained by the spacing of the cells in the serial CCD input register, and which is useful for storing charge packets representative of analog information. The multiplexing feature of this invention allows the same serial input register cell to transfer charge packets sequentially to successive parallel channels. The multiplexer structure is a single multiplexing electrode which overlies the entrances to the parallel storage registers in a staircase configuration. The disposition of the entrances themselves conforms to the staircase configuration of the multiplexing electrode. For this purpose, a plurality of parallel channel stops are used to define the plurality of parallel storage registers in the parallel array, and the channel stops are terminated in the same staircase configuration.

The invention is not limited to the particular staircase configuration disclosed herein, but instead applies to any configuration in which the parallel channel entrances are offset from one another in a configuration to which the multiplexing electrode conforms. The only requirement is that this configuration permit charge transfer between a given serial input register cell and successive parallel channels. No extra implant is required in processing the device of this invention in addition to the implants usually done in two-phase charge coupled device processing.

In summary, while prior art series-parallel-series memories, such as that disclosed in the Erb patent, allowed charge transfer only between a given serial CCD input register cell and a corresponding parallel CCD register entrance, in this invention the same serial CCD input register cell transfers charge to a plurality of parallel CCD register entrances. As a result, the only theoretical constraints on the density of the parallel storage array in this invention are the fine dimensional limitations of photolithographic processing.

BRIEF DESCRIPTION OF THE DRAWINGS

The invention is best understood by reference to the accompanying figures, of which:

FIGS. 1b, 1c and 1d are schematic illustrations of the method of charge transfer employed in the two-phase CCD structure of FIG. 1a;

FIGS. 1e and 1f are exemplary of the two-phase clock signals applied to the charge coupled device of FIG. 1a;

FIG. 5 includes ten successive schematic diagrams of the sequential disposition of a plurality of charge packets in the multiplexed memory of FIG. 4;

FIG. 8 is a timing diagram of the various clock signals applied to the CCD structure of FIG. 6.

DETAILED DESCRIPTION OF THE INVENTION

For a clear understanding of the invention, reference is made to the two-phase charge coupled device of the prior art illustrated in FIG. 1.

Figure 1A:
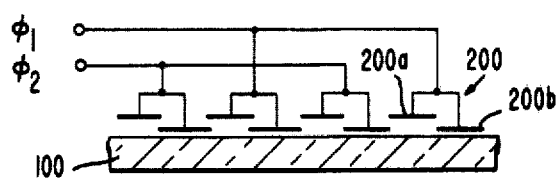
FIG. 1a is a simplified schematic cross sectional view of an exemplary embodiment of a two-phase charge coupled device structure of the prior art.
Figure 1B:
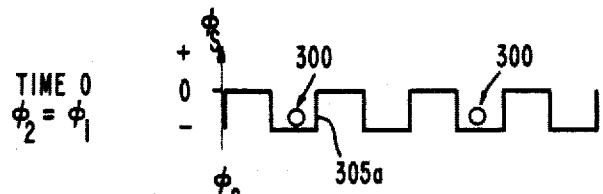

FIG. 1a shows in schematic cross section a semiconductive substrate 100 having an overlying plurality of conductive electrodes 200 each of which comprises an upper level electrode 200a connected to a lower level electrode 200b. Alternate ones of the electrodes 200 are connected to receive clock signals, respectively designated $\phi_1$ and $\phi_2$. The substrate 100 may be N type silicon, for example, and the electrodes 200 may be used to lower the surface potential of the substrate 100 to form a P channel device, in which charge packets comprising holes in the crystal structure of the substrate 100 are transferred beneath the electrodes 200. FIG. 1b is a plot of the surface potential $\phi_s$ in the substrate 100 directly underlying each of the plurality of electrodes 200 in the presence of positive charge packets 300 when the voltage $\phi_2$ equals the voltage $\phi_1$. The positive charge packets 300 naturally reside in the bottom or well portions 305 of the surface potential $\phi_s$.

Figure 1C:
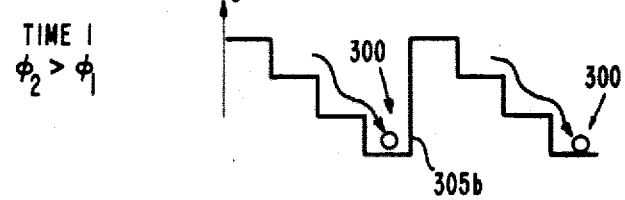
Figure 1D:
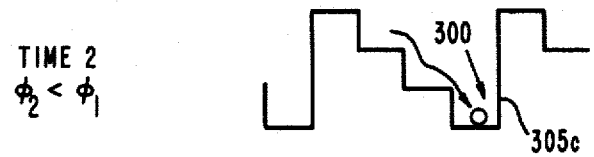

FIG. 1c illustrates the surface potential $\phi_s$ directly underlying the plurality of electrodes 200 in the substrate 100 when the voltage $\phi_1$ is less than the voltage $\phi_2$. The positive charge packets 300 naturally move to the right from the well 305a of FIG. 1b to the well 305b of FIG. 1c in order to continue residing in the lowest potential well in the surface potential $\phi_s$. Finally, FIG. 1d shows the surface potential $\phi_s$ when $\phi_2$ is less than $\phi_1$. Again, the plurality of positive charge packets 300 move to the right in order to follow the change in the surface potential $\phi_s$. If the clock signals $\phi_1$ and $\phi_2$ are generated as two-pulse trains of the same frequency and opposite phase, as illustrated in FIGS. 1e and 1f, the transfer of positive charge packets from left to right in the CCD structure of FIG. 1a will be continuous, since the surface potential will alternate between the configurations illustrated in FIGS. 1c and 1d.

Figure 1E:
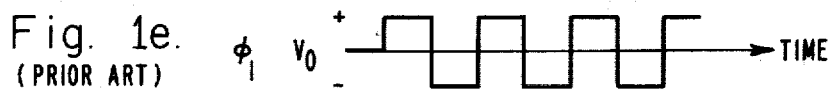
Figure 1F:
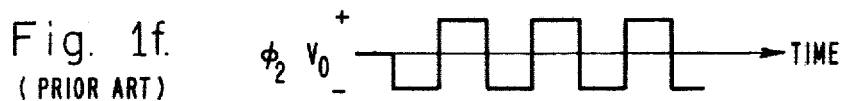
Figure 2:
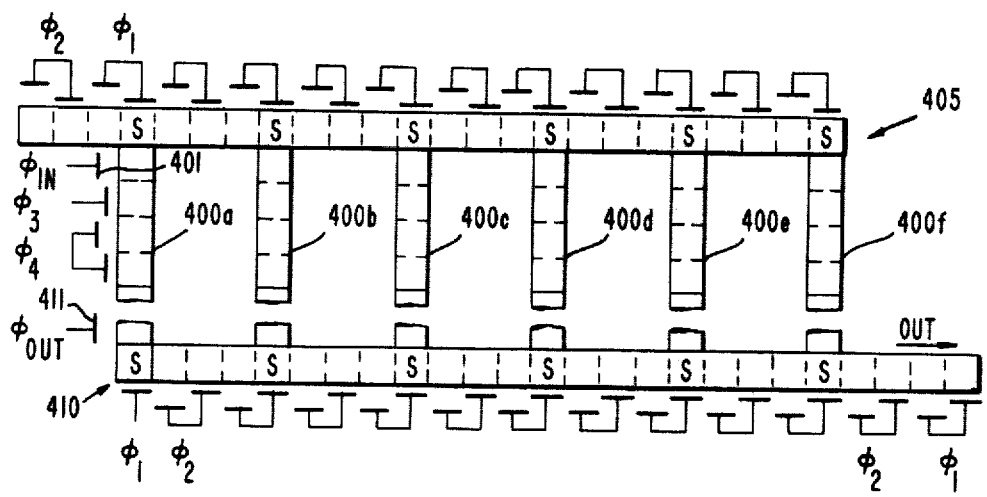
FIG. 2 is exemplary of a prior art charge coupled device series-parallel-series memory.

FIG. 2 is a simplified schematic diagram of an exemplary prior art series-parallel-series CCD memory. A parallel storage array includes a plurality of parallel CCD registers 400a through f. A serial CCD input register 405 supplies charge packets concurrently to each of the parallel storage registers 400 under the control of a transfer gate 401 connected to receive a clock signal $\phi_{in}$. The parallel registers 400 output charge packets into the CCD serial output register 410 under the control of a transfer gate 411 connected to receive a clock signal $\phi_{out}$. The serial registers 405, 410 are two-phase CCD structures of the type illustrated in FIG. 1a. The plurality of parallel registers 400 are shown in FIG. 2 as two-phase CCD registers of the type illustrated in FIG. 1a, although the parallel storage registers 400 may be four-phase CCD devices. Charge travels serially from left to right in the input register 405 in the manner described above with reference to FIG. 1. Whenever $\phi_1$ is less than $\phi_2$, charge packets will be stored in each of the storage cells labeled S in the serial input register 405. In order to maintain isolation between adjacent charge packets in the serial input register 405, each pair of charge packets is separated therein by three empty cells. Whenever $\phi_{in}$ is less than $\phi_1$, charge flows from the storage cells labeled S in the serial register 405 into corresponding ones of the parallel registers 400. Charge is then transferred through the parallel storage registers 400 in a manner similar to that described above with reference to FIG. 1.

The signals $\phi_3$ and $\phi_4$ are two-phase clock signals similar to the clock signals illustrated in FIGS. 1e and 1f. Whenever $\phi_{out}$ is less than $\phi_4$, charge is transferred from each of the parallel storage registers 400 into adjacent storage cells labeled S in the serial output register 410. The charge may then be transferred serially from left to right in the output register 410 in the same manner as that described above in connection with FIG. 1a.

Figure 3:
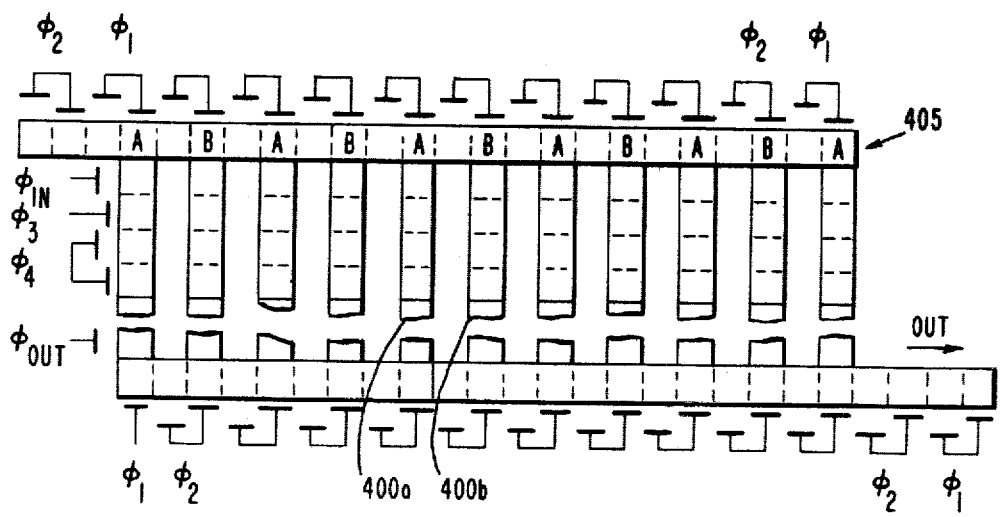
FIG. 3 is exemplary of an interlaced charge coupled device series-parallel-series memory of the prior art which is an improvement on the memory of FIG. 2.

FIG. 3 is exemplary of the interlaced series-parallel-series CCD memory disclosed in the Erb patent. It is immediately apparent upon comparison of FIGS. 2 and 3 that the spacing between parallel storage registers has been halved, thus doubling the storage density of the parallel array 400. As described in the Erb patent, when $\phi_1$ is less than $\phi_2$, charge packets reside in the storage cells labeled A in the serial input register 405. $\phi_{in}$ may then be dropped to transfer charge from the storage cells A into the adjacent parallel registers 400a. Later, when the serial input register 405 has again been filled, and when $\phi_2$ is less than $\phi_1$, charge packets reside in the storage cells labeled B in the serial input register 405. Then, when $\phi_{in}$ is dropped, charge packets are transferred from the storage cells B into the remaining parallel storage registers 400b. Although the interlaced series-parallel-series CCD memory of FIG. 3 doubles the density of the parallel array, that density is still constrained by the spacing of the storage cells of the series input CCD register 405. Specifically, the number of parallel registers receiving charge from a two-phase serial input register preferably should not exceed the number of electrode pairs in the serial input CCD register.

Figure 4:
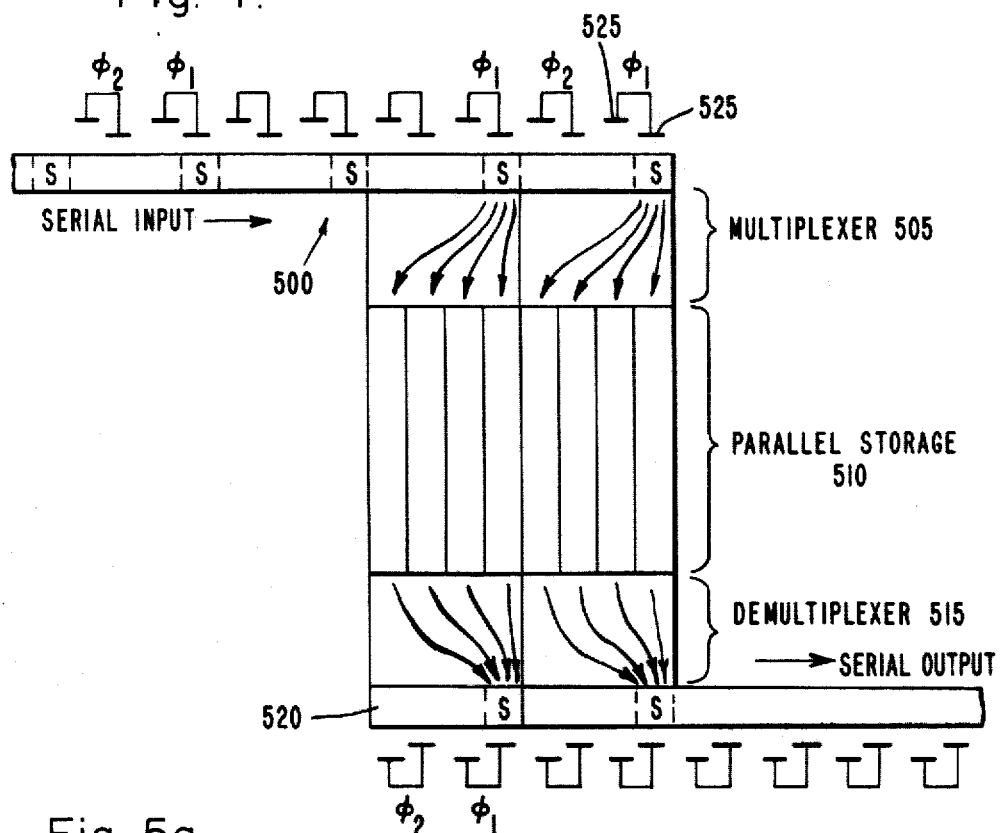
FIG. 4 is a simplified schematic diagram of the multiplexed CCD series-parallel-series memory of the present invention.

FIG. 4 is a schematic diagram of the multiplexed CCD series-parallel-series memory of the present invention in which the foregoing difficulties are overcome. A serial input register 500 is disposed adjacent a multiplexer 505. The multiplexer 505 feeds charge sequentially to a plurality of parallel CCD storage registers 510. Charge is transferred from the parallel storage registers 510 into the demultiplexer 515. The demultiplexer 515 sequentially transfers the charge into a serial output register 520.

Charge transfer in the serial input register 500 is controlled by a plurality of conductive electrodes 525 arranged in pairs of upper and lower electrodes 525a and 525b, with alternate electrode pairs being connected to receive the $\phi_1$ and $\phi_2$ clock signals respectively, all in a manner identical to that described with reference to the electrodes 200 of FIG. 1a. Whenever the voltage of $\phi_1$ is less than the voltage of $\phi_2$, charge packets reside in the storage cells labeled S in the serial input register 500.

FIG. 4 clearly shows that the present invention departs from the prior art in that charge is transferred sequentially from one storage well S into a plurality of parallel storage registers 510. In the embodiment illustrated in FIG. 4, charge is transferred from one storage well S successively into four different parallel storage registers 510. This charge transfer is accomplished by means of the multiplexer 505. Similarly, the demultiplexer 515 takes charge packets from the four parallel storage registers 510 and transfers them successively to a single storage well S in the serial output register 520. It should be readily apparent to those skilled in the art that, using the multiplexing technique illustrated in FIG. 4, one storage well S in the serial input register 500 may transfer charge through the multiplexer 505 to any number of parallel storage register 510, so that the density of the parallel storage array 510 in FIG. 4 may be much greater than that illustrated in FIG. 4. In the embodiment illustrated in FIG. 4, the density of the parallel storage array is doubled with respect to that of the interleaved device illustrated in FIG. 3. Thus, it may be possible to triple or even quadruple the storage density by using this invention.

Figure 5A:
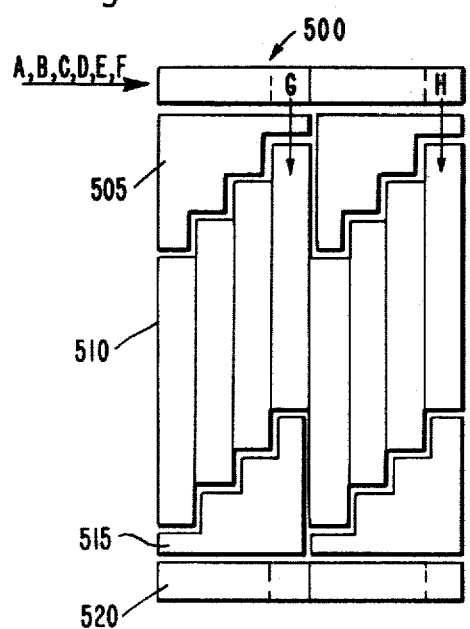
FIG. 5a illustrates the location of the charge packets during a first clock period.
Figure 5B:
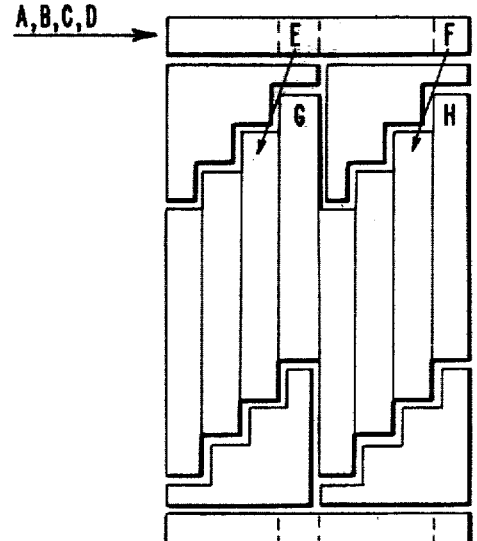
FIG. 5b illustrates a location of the charge packets during a second clock period.
Figure 5C:
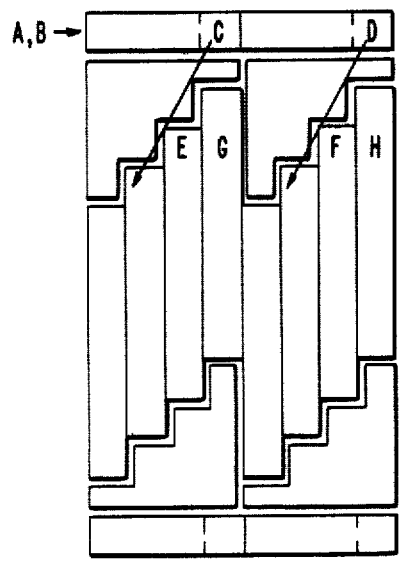
FIG. 5c illustrates a location of the charge packets during a third clock period.
Figure 5D:
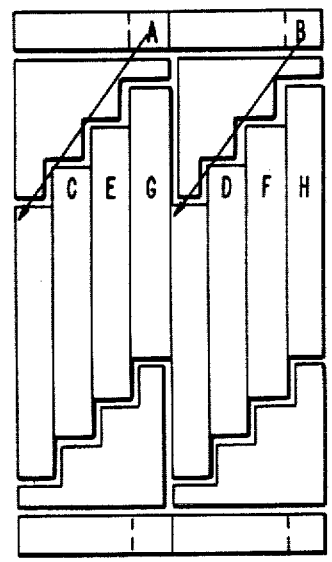
FIG. 5d illustrates a location of the charge packets during a fourth clock period.
Figure 5E:
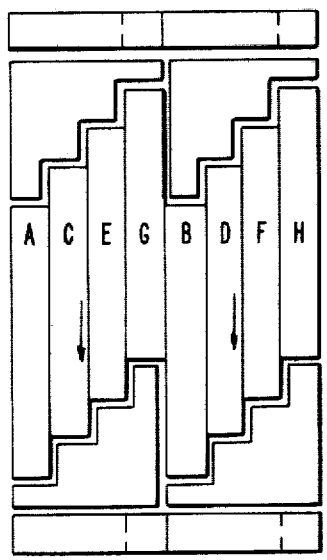
FIG. 5e illustrates a location of the charge packets during a fifth clock period.
Figure 5F:
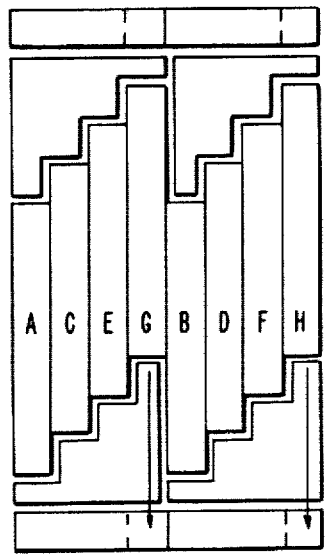
FIG. 5f illustrates a location of the charge packets during a sixth clock period.

FIGS. 5a-j schematically illustrate a method for multiplexing the charge transfer between the serial input register 500 and the plurality of parallel storage registers 510 in accordance with the present invention. FIG. 5a illustrates a plurality of charge packets, A, B, C, D, E, F, G, H to be stored. Two charge packets, G and H are first transferred into two of the storage wells S of the serial input register 500 from which they are next transferred by the multiplexer 505 into two of the parallel storage registers 510. Referring to FIG. 5b, the serial input register 500 then transfers the next two charged packets, E and F, into the storage wells previously occupied by the charge packets G and H. The charge packets E and F are then transferred by the multiplexer 505 into two other parallel storage registers 510. The same process is repeated as shown in FIG. 5c for the charge packets C and D, and in FIG. 5d for the charge packets A and B. The result is shown in FIG. 5e, where the charge packets A through H are shown arranged in a multiplexed order in the parallel array 510 by operation of the multiplexer 505.

Figure 5G:
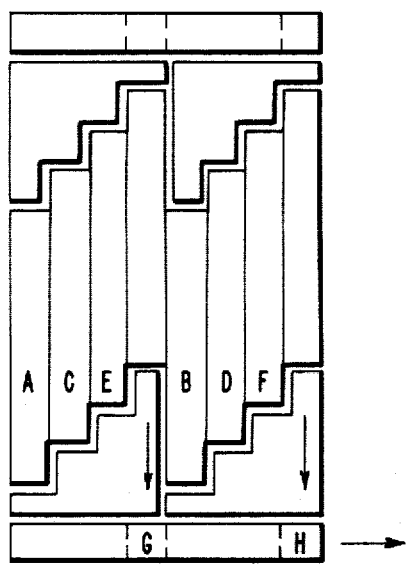
FIG. 5g illustrates a location of the charge packets during a seventh clock period.
Figure 5H:
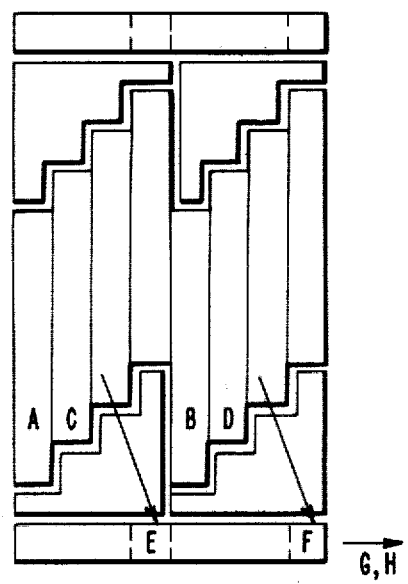
FIG. 5h illustrates a location of the charge packets during a eighth clock period.
Figure 5I:
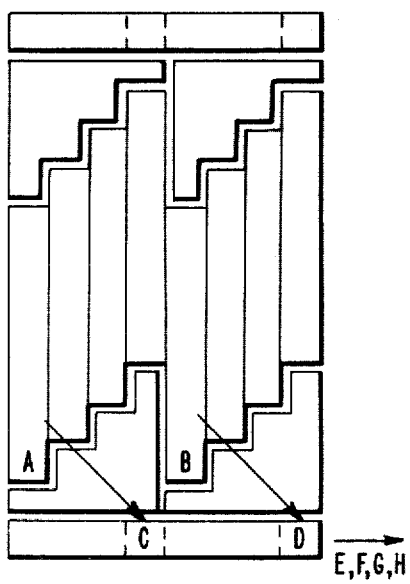
FIG. 5i illustrates a location of the charge packets during a ninth clock period.
Figure 5J:
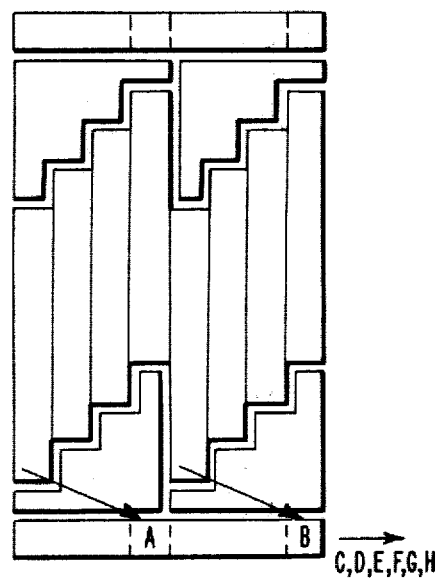
FIG. 5j illustrates a location of the charge packets during a tenth clock period.

The demultiplexing process illustrated in FIGS. 5g, h, i and j is seen to be the inverse of the multiplexing process illustrated in FIGS. 5a, b, c and d respectively. Charge is transferred successively into a single storage well in the output register 520 from respective ones of the parallel channels 510. FIG. 5j illustrates that the operation of the demultiplexer 515 restores the original order of the charge packets A through H at the output of the serial output register 520.

FIG. 6 illustrates the preferred embodiment of the invention which uses a multiplexing technique similar to that discussed above in connection with FIGS. 4 and 5. FIG. 6 illustrates a plan view of a portion of a semiconductor substrate embodying the device of FIG. 4. The semiconductor substrate is of N-type conductivity. The serial input register 500 is defined by two parallel channel stops 600a and 600b. The channel stops 600 are regions in the silicon substrate which have an especially high concentration of implanted N-type impurity. Charge transfer in the serial input register 500 is controlled by a plurality of electrodes 525 shown in hidden line they are formed in a first layer of polysilicon overlying a thin oxide film deposited on the silicon substrate. A second thin film of oxide is deposited over the first layer of polysilicon electrodes 525b, followed by a second layer of polysilicon electrodes 525a, shown in solid line. Alternate pairs of the upper and lower electrodes 525a and 525b are connected to receive respective ones of serial two-phase clocks $\phi_{S1}$ and $\phi_{S2}$. It should be understood that each of the upper level electrodes 630 overlies a barrier of implanted N-type impurity in the substrate.

The channel stop 600b has two openings 605a and 605b through which charge may leave the serial input register 500. A channel stop portion 600b' is disposed between the openings 605a and 605b in order to prevent charge from becoming trapped in the substrate surface covered by the channel stop port on 600b'. A transfer gate 610, formed with the second layer of polysilicon, is disposed over the exits 605 and overlies a portion of the lower level polysilicon electrodes 525b adjacent the exits 605. The multiplexer 505 is a single electrode integrally formed in the lower layer of polysilicon and underlies a portion of the transfer electrode 610. Adjacent the multiplexing electrode 505 are the plurality of parallel CCD storage registers 510 defined by a plurality of parallel elongate, channel stops 615 of the same N-type implanted impurity as the channel stops 600. Entrances 635 to the parallel channels 510 are defined by the terminations 620 of the parallel channel stops 615b, 615c and 615d. The terminations 620b, 620c, 620d are offset from one another in a direction parallel to the direction of the parallel storage channels 510 in a staircase configuration to which the multiplexing electrode 505 substantially conforms.

Charge transfer in the parallel storage registers 510 is controlled by a plurality of overlying parallel electrodes 625, shown in hidden line, formed with the lower layer of polysilicon, and by another plurality of overlying electrodes 630, shown in solid line, formed with the upper layer of polysilicon. Adjacent pairs of upper and lower level electrodes 625, 630 are connected together, and these pairs are connected successively to receive four-phase clock signals $\phi_{P1}$, $\phi_{P2}$, $\phi_{P3}$ and $\phi_{P4}$, forming a four-phase charge coupled device structure in each of the parallel storage registers 510. Electrodes 625a, 625b, 625c and 625d and electrodes 630a, 630b, 630c and 630d are disposed adjacent the multiplexing electrode 505. It may be seen from FIG. 6a that the electrodes 625a-d and 630a-d are of progressively different lengths, in conformance with the staircase configuration of the multiplexing electrode 505. The multiplexing electrode 505 underlies a portion of each of the electrodes 630a-d near the entrances 635a-d to each of the parallel storage registers 510a-d respectively.

Charge transfer between the serial input register 500 and the plurality of parallel storage registers 510 is controlled by the clock signal $\phi_{sp}$ which is applied to the transfer gate 610 and to the multiplexing electrode 505. As will be discussed below, the timing of $\phi_{sp}$ depends upon the timing of both the serial clocks $\phi_{s1}$, $\phi_{s2}$ and the parallel clocks $\phi_{P1}$, $\phi_{P2}$, $\phi_{P3}$. $\phi_{P4}$. The preferred timing of these clocks will be discussed later in this specification.

Figure 6A:
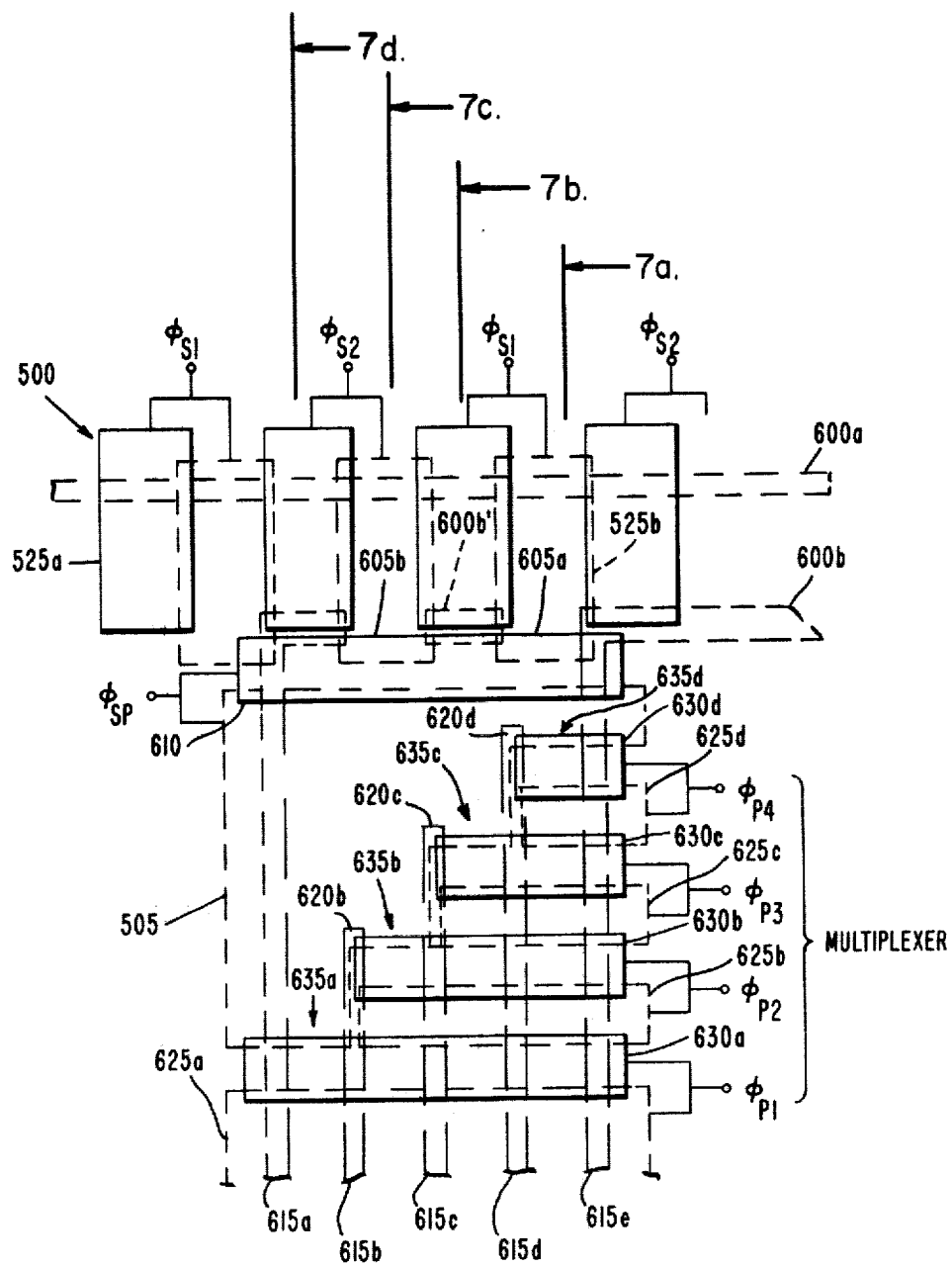
FIG. 6 is a plan view of a portion of a semiconductive chip incorporating the preferred embodiment of the multiplexed series-parallel-series CCD memory of the present invention, of which FIG. 6a includes part of the plan view and FIG. 6b includes the remainder of the plan view.
Figure 6B:
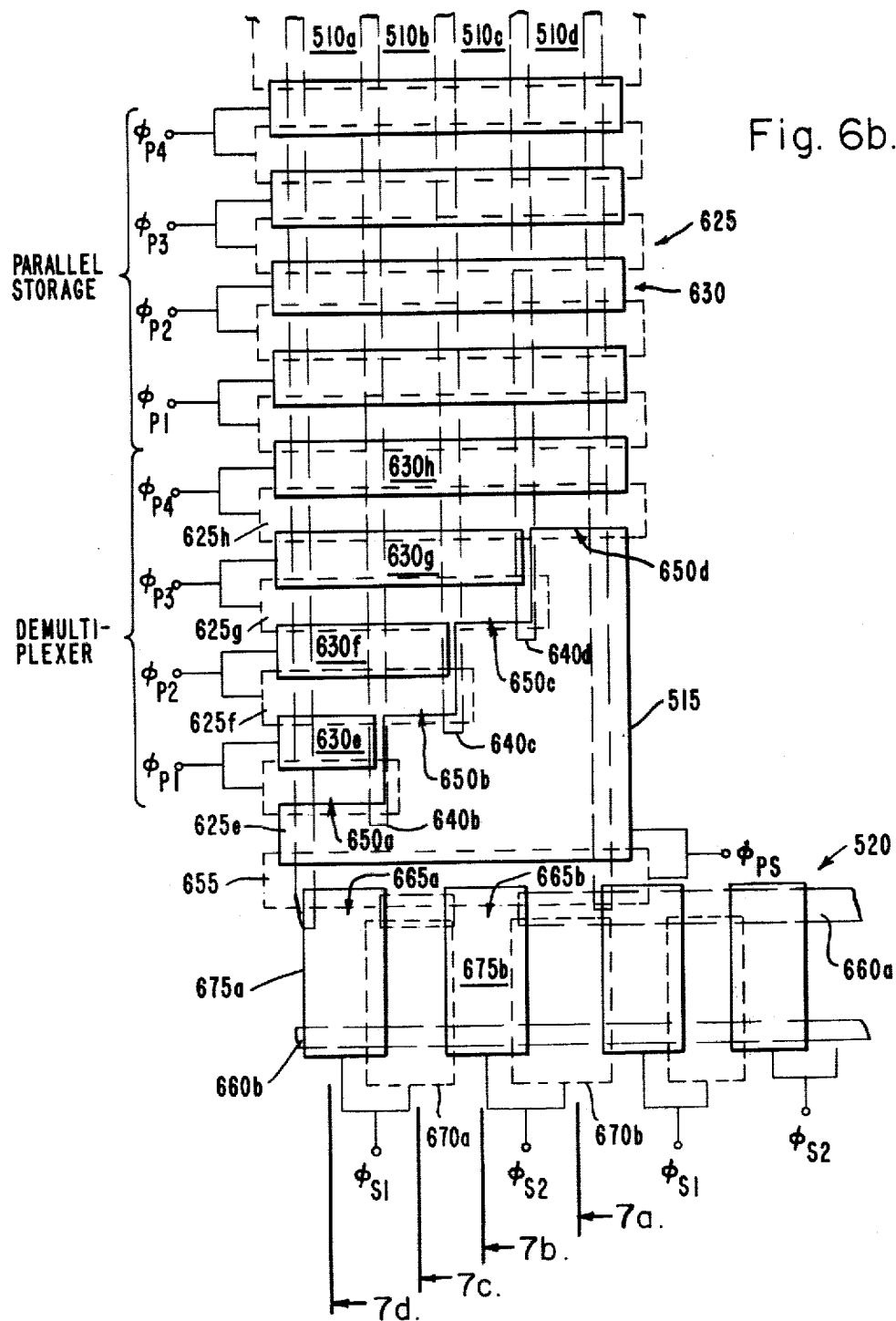

Exits 650 from each of the parallel storage registers 510 are defined by lower terminations 640b, 640c, 640d of the channel stops 615b, 615c, 615d respectively, offset from one another in another staircase configuration, as shown in FIG. 6b. A demultiplexing electrode 515 is formed during the deposition of the upper polysilicon layer. It overlies lower level electrodes 625e, 625f, 625g, 625h in a similar staircase configuration and is coplanar with a set of upper level output electrodes 630e, 630f, 630g, and 630h. The electrodes 625e-h and 630e-h, are of progressively increasing length to correspond to the staircase configuration of the demultiplexing electrode 515 which overlaps the lower level electrodes 625e-h at the parallel register exits 650a-d. The demultiplexing electrode 515 also partially overlies a transfer electrode 655 formed concurrently with the deposition of the lower polysilicon layer.

The serial CCD output register 520 is defined by two parallel channel stops 660a and 660b of the same impurity type as the channel stops 600. The channel stop 660a is formed with two openings 665a and 665b to permit charge transfer into the serial output register 520. Charge flow in the serial output register 520 is controlled by a plurality of lower and upper level electrodes 670 and 675 formed of the lower and upper layer of polysilicon respectively. Upper layer electrodes 675a and 675b partially overlie the openings 665a and 665b respectively. They also partially overlie the transfer electrode 655. The demultiplexing electrode 515 and the transfer electrode 655 are both connected to clock signal $\phi_{PS}$. The clock signal $\phi_{PS}$ therefore controls charge transfer from the plurality of parallel storage registers 510 through either one of the openings 665 into the serial output register 520. Timing of the transfer clock signal $_{PS}$ is dependent upon the timing of the parallel clock signals and the serial clock signals, as will be discussed later in this specification.

FIGS. 7a, b, c, and d are partial cross-sectional views shown in simplified schematic form and taken along lines 7a, b, c, d of FIG. 6 respectively. It should be understood that each of the upper level electrodes 630 overlies a barrier of implanted N-type impurity in the substrate. Such an implanted barrier is well known in the art and provides superior charge transfer characteristics. A plurality of barrier implants may be formed without additional masking steps during processing by implanting an N-type impurity over the entire substrate surface after the formation of the lower level polysilicon electrodes 625 but before the formation of the upper level polysilicon electrodes 630, as is well known to those skilled in the art.

The preferred timing arrangement of the clock signals is shown in FIG. 8 for the device illustrated in FIG. 6. It should be noted that the timing illustrated in FIG. 8 of these clock signals results in a charge transfer sequence which is a variation of the sequence illustrated in FIGS. 5a-5j and which results in a more efficient use of the parallel array 510.

Figure 7:
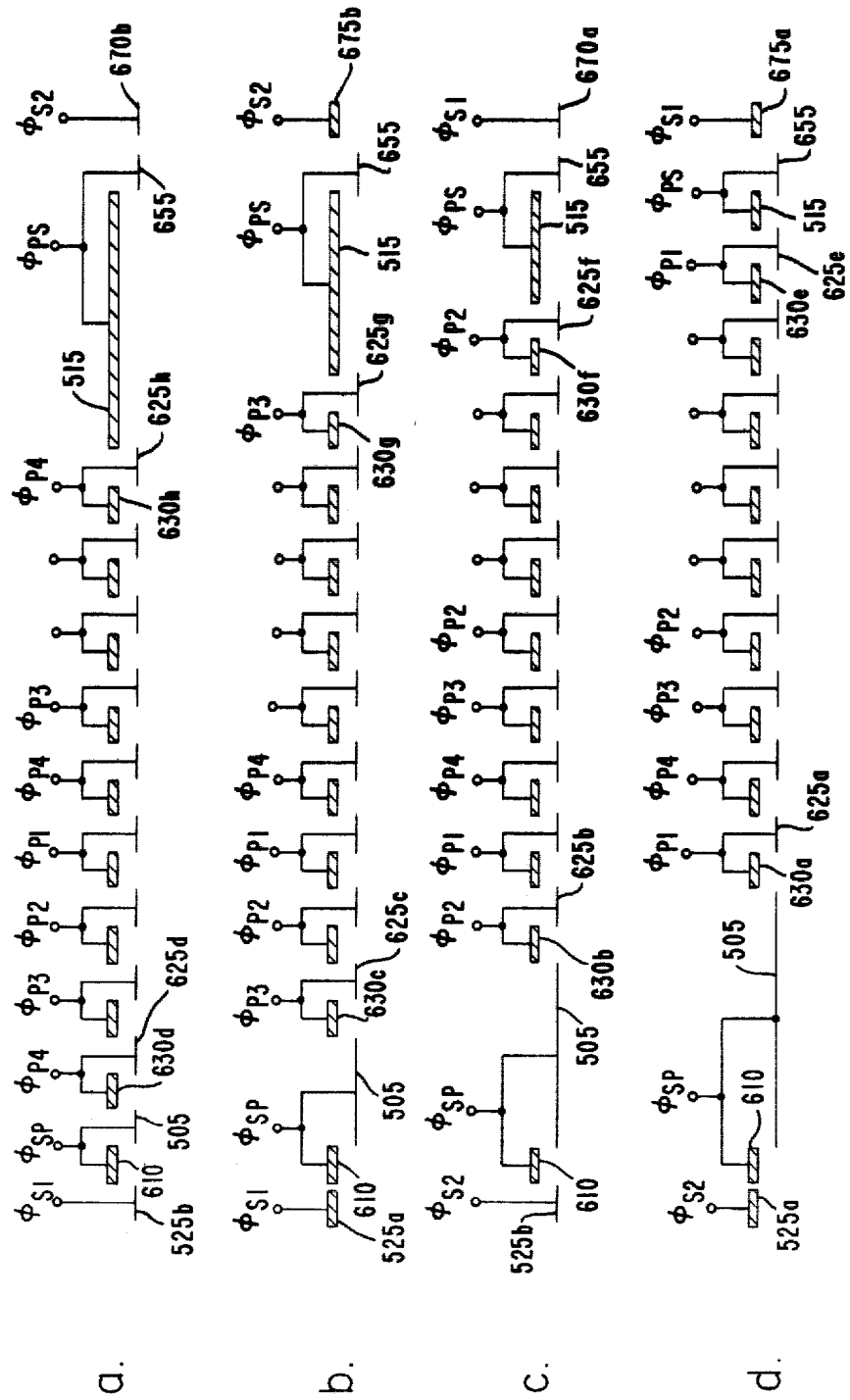
FIGS. 7a, 7b, 7c and 7d are partial cross-sectional views drawn in schematic form of the device of FIG. 6 taken along lines 7a, 7b, 7c and 7d of FIG. 6 respectively, showing the electrode and implant structure of the device of FIG. 6.

The operation of this invention will now be discussed with simultaneous reference to FIGS. 6, 7 and 8. FIG. 8 shows that the various clock signals are drop clocks and are preferably negative pulse waveforms referenced to zero volts, preferably having a negative peak voltage on the order of 10 to 20 volts. FIG. 8 also indicates that the serial input and output registers 500 and 520 are operated as two-phase charge coupled devices under the control of clock signals $\phi_{S1}$ and $\phi_{S2}$. Therefore, charge packets are stored under every fourth electrode in these devices as discussed above in connection with FIGS. 1 and 2. Hence, whenever $\phi_{S1}$ is less (i.e., more negative) than $\phi_{S2}$, as shown at time $t_1$ in FIG. 8, charge packets may reside in the serial registers beneath any of the lower level electrodes which are connected to the clock signal $\phi_{S1}$. At time $t_2$, when the clock signal $\phi_{sp}$ is pulsed negatively, charge is pulled from beneath the electrode 525b, beneath entrance 605a to move under the transfer gate 610 and held beneath the multiplexing electrode 505. Referring now to FIG. 7d, in conjunction with FIG. 6a, it is seen that at time $t_3$, when the clock signal $\phi_{P1}$ is pulsed negatively, this charge is attracted from beneath the multiplexing electrode 505 toward the first parallel storage register 510a, passing through the entrance 635a under the electrode 625a.

At a later time $t_4$, when $\phi_{S1}$ is next pulsed negatively, a second, new charge packet resides beneath the lower level electrode 525b. This charge packet is pulled beneath the transfer gate 610 at time $t_5$ when $\phi_{SP}$ is next pulsed negatively. At time $t_6$, when $\phi_{P2}$ is pulsed negatively, the charge packet enters the second parallel storage register 510b through entrance 635b to be held beneath electrode 625b as may be seen by reference to FIG. 7c.

Subsequently, at time $t_7$, when ($\phi_{S1}$) is pulsed negatively for the third time, a third charge packet resides under the electrode 525b adjacent the opening 605a. At time $t_8$, when the transfer gate 610 receives the pulse $\phi_{SP}$ for the third time, this charge is pulled beneath the transfer gate 610 to reside beneath the multiplexing electrode 505 when $\phi_{SP}$ is pulsed negatively. At time $t_9$, when $\phi_{P3}$ is pulsed negatively, this charge packet is pulled from beneath the multiplexing electrode 505 electrode through the entrance 635c into the third parallel channel 510c to be held beneath the electrode 625c, as may be seen by reference to FIG. 7b.

Finally, at time $t_{10}$, a fourth charge packet resides beneath the electrode 525b adjacent the opening 605a when $\phi_{S1}$ is pulsed negatively for the fourth time. At time $t_{11}$, when $\phi_{SP}$ is pulsed negatively, this charge is transferred beneath the transfer electrode 610 to reside beneath the multiplexing electrode 505. At time $t_{12}$, when $\phi_{P4}$ is pulsed negatively, the charge packet flows into the fourth parallel storage register 510d through entrance 635d to be held beneath electrode 625d as may be seen by reference to FIG. 7a. Thus, during four successive periods of the clocks $\phi_{S1}$ and $\phi_{S2}$, four charge packets have been successively transferred from beneath the electrode 525b to respective ones of the four parallel storage registers 510a-d. The foregoing multiplexing cycle is then repeated periodically beginning with each occurrence of $\phi_{P1}$ and charge packets are stepped in the four registers 610a-d toward the electrodes 625a-d and 630a-d.

Demultiplexing of charge into the serial output register 520 is the inverse of the above-described sequence. Specifically, at time $t_{13}$ when $\phi_{P1}$ is pulsed negatively, charge resides under the electrode 625e in the first parallel storage register 510a. Referring now to FIGS. 7d and 6b, at time $t_{14}$ when $\phi_{PS}$ is pulsed negatively for the first time in the demultiplexing sequence to be described, this charge is attracted through exit 650a from the first parallel storage register 510a beneath the demultiplexing electrode 515 to be held beneath the transfer electrode 655. Subsequently, at time $t_{15}$, when $\phi_{S1}$ is pulsed negatively, charge flows from beneath the transfer electrode 655 through the exit 665a, beneath the upper level electrode 675a to be held under the lower level electrode 670a.

At a later time $t_{16}$, when $\phi_{P2}$ is pulsed negatively, charge packet resides under the lower level electrode 625f in the second parallel storage register 510b. Referring now to FIGS. 7c and 6b, at time $t_{17}$ when $\phi_{PS}$ is pulsed negatively for the second time in the current demultiplexing sequence, the charge packet is attracted from the second parallel register 510b through the exit 650b and beneath the demultiplexing electrode 515 to be held beneath the transfer electrode 655. Then, at time $t_{18}$, when $\phi_{S1}$ is next pulsed negatively, charge flows from beneath the transfer electrode 655 through the entrance 665a under the upper level electrode 675a to be held beneath the lower level electrode 670a.

Similarly, at time $t_{19}$, when $\phi_{P3}$ is pulsed negatively, a charge packet resides beneath the lower level electrode 625g in the third parallel register 510c. Referring now to FIGS. 7b and 6b, at time $t_{20}$, when $\phi_{PS}$ is pulsed negatively for the third time in the demultiplexing sequence, this charge packet is pulled out of the parallel register 510c through exit 650c, under demultiplexing electrode 515, to be held beneath the transfer electrode 655. At time $t_{21}$, when $\phi_{S1}$ is next pulsed negatively, the charge packet is attracted from beneath the transfer electrode 655, through the exit 665a beneath the upper level electrode 675 to be held beneath the lower level electrode 670a in the serial output register 520.

Finally, at a time $t_{22}$, when $\phi_{P4}$ is pulsed negatively, a charge packet resides in the fourth parallel register 510d beneath lower level electrode 625h. Reference to FIG. 7l and FIG. 6b, when $\phi_{PS}$ is pulsed negatively at $t_{23}$, for the fourth time in the sequence this charge is attracted from beneath the electrode 625h through exit 650d, beneath the multiplexing electrode 515 to reside beneath the transfer electrode 655. Subsequently, at time $t_{24}$ when $\phi_{S1}$ is next pulsed negatively, this charge packet is pulled from beneath the transfer electrode 655 through exit 665a under upper level electrode 675a to be held beneath lower level electrode 670a in the output register 520. The foregoing demultiplexing cycle is repeated periodically, beginning with each occurence of the clock signal $\phi_{P1}$. Thus, in a manner analogous to the multiplexing sequence by which four charge packets are sequentially read from the serial input register 500 into the four parallel registers 510a–d, the demultiplexing sequence just described effects the sequential transfer of four charge packets from those parallel registers into a particular storage well of the serial output register 520.

It is now apparent that the number of parallel channels 510 into which charge is transferred from a single storage well S of the serial input register 500 must equal the number of clocks which control charge transfer in each parallel channel 510. Specifically, in the device illustrated in FIG. 6, each of the parallel registers 510 is a four-phase CCD structure, and therefore the storage well S of the serial input register 500 transfers charge sequentially into four parallel registers 510a, b, c and d.

If, instead, the parallel storage register 510 were a five-phase CCD structure, involving five separate clocks, the single storage well S in the serial input register 500 would transfer charge successively into five of the parallel storage registers 510.

Although the staircase configuration of the multiplexing and demultiplexing electrode of FIG. 6a is not absolutely required, it is an essential feature of the invention that each of the entrances 635 and exits 650 of the parallel channels underlie different ones of the gates 625 and 630 which are controlled by different ones of the parallel clock signals $\phi_{P1}$ through $\phi_{P4}$. Thus, it will be apparent to those skilled in the art that other configurations besides the staircase configuration of FIG. 6 are possible to implement the multiplexing system of this invention, and are therefore within the scope of this invention.

What is claimed is:

1. A charge coupled device for multiplexed serial-to-parallel storage formed on a semiconductive substrate comprising:

a plurality of parallel elongate channel stops formed in said substrate defining N parallel channels, said N channel stops extending in a first direction to their N terminations, the terminations of adjacent ones of said channel stops being progressively offset in said first direction from one another to define a corresponding plurality of N charge flow entrances progressively offset from one another in said first direction adjacent said progressively offset N channel stop terminations;

a plurality of N parallel elongate insulated electrodes terminated in N terminations and overlying said substrate extending in a second direction transverse to said first direction to their N terminations, terminations of adjacent ones of said electrodes being progressively offset in said second direction from one another in cooperation with said N terminations of said N channel stops so that said N electrode terminations are each adjacent a corresponding one of said N channel stop terminations and so that a progressively different one of said N electrode terminations is adjacent a progressively different one of said N channel stop terminations, the first electrode termination being adjacent the first one of said N entrances and the first of said N channel stop terminations, and the Nth electrode termination being adjacent the Nth one of said N entrances and the Nth one of said N channel stop terminations:

a multiplexing electrode overlapping said N channel stop terminations and said N electrode terminations and surrounded by a continuous outside edge, said outside edge comprising a plurality of 2N continous outside edge portions, alternate ones of said 2N outside edge portions extending in said second direction and offset progressively in said first direction from one another cooperatively with said progressively offset N channel stop terminations so as to be adjacent corresponding ones of said N channel stop terminations and corresponding ones of said N electrode terminations, the first of said alternate ones of said outside edge portions being adjacent the first of said N electrode terminations and the first of said N channel stop terminations and the Nth one of said alternate ones of said 2N outside edge portions being adjacent the Nth one of said electrode terminations and the Nth one of said channel stop terminations, the remaining ones of said 2N outside edge portions extending in said first direction so as to connect between adjacent ones of said alternate edge portions, and being parallel to and adjacent corresponding ones of said N channel stops, the first one of said remaining ones of said edge portions being adjacent the first channel stop and the Nth one of said remaining edge portions being adjacent said Nth channel stop;

serial input means for transferring charge having a charge flow channel in said substrate including means for forming a charge storage potential well in said substrate into which a charge packet may be serially transferred through said register, said multiplexing electrode at least partially overlying said charge storage potential well; and means for applying N phase clock signals to said N parallel electrodes and for applying a clock signal to said multiplexing electrode in synchronism with said N phase clock signals, the first of said N phase clock signals being applied to the first one of said N parallel electrodes and the Nth one of said N phase clock signals being applied to the Nth one of said N parallel electrodes.

2. The device of claim 1 wherein said N phase clock signals comprise a plurality of N pulse trains of equal frequency and different phases, the first phase being applied to said first parallel electrode during a first clock period and the Nth phase being to the Nth parallel electrode during the Nth clock perios.

3. The device of claim 1 wherein each of said N parallel electrodes comprise two insulated electrodes connected together, one of said two insulated electrodes formed at a first upper level over said substrate and the other of said two insulated electrodes formed in a lower level closer to said substrate.

4. The device of claim 3 wherein said multiplexing electrode is formed at a level corresponding to said lower level, and wherein said alternate ones of said outside edge portions are adjacent the upper level electrodes of said N parallel electrodes.

5. The device of claim 4 wherein said N channel stops are terminated at their opposite ends in a second plurality of N terminations progressively offset from one another in said first direction so that at least N−2 of said N channel stops extend in approximately equal lengths in said first direction;

said device further comprising a second plurality of N parallel electrodes adjacent said second plurality of N channel stop terminations, said second plurality of N parallel electrodes extending in said second direction to their terminations to define a second plurality of N parallel electrode terminations progressively offset in said second direction from one another cooperatively with said second plurality of progressively offset channel stop terminations;

said device further comprising a demultiplexing electrode formed in said upper level with said upper level parallel electrodes and comprising a plurality of offset electrode portions facing said second plurality of offset electrode terminations and spanning between adjacent ones of said channel stops at each of said second plurality of channel stop terminations; and means for applying said N phase clock signals to said second plurality of N parallel electrodes;

a serial output register including a serial charge storing potential well underlying said demultiplexer electrode, said demultiplexer electrode receiving a clock signal in synchronism with said N phase clock signals applied to said first and second pluralities of parallel electrodes, whereby charge packets serially transferred under said multiplexing electrode are distributed in the turn among said N parallel channels and are distributed in the same serial order from said N parallel channels in serial fashion under said demultiplexing electrode.

* * * * *